United States Patent [19]

Ferry et al.

[11] Patent Number: 5,028,925
[45] Date of Patent: Jul. 2, 1991

[54] SIGMA-DELTA CONVERTER WITH IMPROVED TRANSFER FUNCTION

[75] Inventors: Michel Ferry, Vallauris; Jean-Pierre Pantani, Saint Jeannet; Gerard Orengo, Biot; Gerard Richter, Nice, all of France

[73] Assignee: International Business Machines Corporation, Armonk, N.Y.

[21] Appl. No.: 410,166

[22] Filed: Sep. 20, 1989

[30] Foreign Application Priority Data

Jul. 12, 1989 [FR] France ............................ 89 480108

[51] Int. Cl.$^5$ .............................................. H03M 3/00
[52] U.S. Cl. ......................................... 341/143; 341/118
[58] Field of Search ............... 341/143, 162, 163, 164, 341/165, 118; 375/28, 29, 34

[56] References Cited

U.S. PATENT DOCUMENTS

| 3,710,056 | 1/1973 | Tomozawa | 375/28 |
| 4,009,475 | 2/1977 | DeFreitas | 341/143 |
| 4,174,502 | 11/1979 | Wilson et al. | 375/28 |
| 4,283,786 | 8/1981 | Okamura | 375/34 X |
| 4,746,899 | 5/1988 | Swanson et al. | 341/122 |
| 4,897,856 | 1/1990 | Cukier et al. | 375/28 |

FOREIGN PATENT DOCUMENTS 0119529 2/1984 Fed. Rep. of Germany .

Primary Examiner—Benjamin R. Fuller
Assistant Examiner—Randy W. Gibson
Attorney, Agent, or Firm—Edward H. Duffield

[57] ABSTRACT

A sigma-delta converter including a switching component controlled by a first clock having determined transitions for generating a train of sigma-delta code pulses corresponding to an analog input value. The sigma-delta includes circuits for generating a second clock of a same frequency as the first clock and having a negative transition followed after a defined period of time (d2) by a positive transition. The determined transitions of the first clock controlling the switching element occur during said defined period of time. There is also included a circuit controlled by the sigma-delta code pulse train and said second clock for generating a train of sigma-delta pulses insensitive to the mismatch of the rise and fall times of the switching element thereby improving the linearity and the signal-to-noise ratio of the converter. The control of the period of time allows varying of the energy of the pulses in order to provide pulse trains which, when applied to a sigma-delta decoder, provide an analog output value representative of, but attenuated with respect to, the analog input value.

2 Claims, 8 Drawing Sheets

SIGMA-DELTA CONVERTER WITH IMPROVED TRANSFER FUNCTION

TECHNICAL FIELD OF THE INVENTION

The present invention relates to converters having a feedback loop and particularly to a sigma-delta modulation converter for performing an attenuation function and having a transfer function insensitive to the rise and fall time mismatch of the switching components.

Background Art

Sigma-delta Modulation (SDM) converters (also referred to as analog feedback coders) have recently achieved popularity for use in integrated circuit data converters, both analog-to-digital (A/D) and digital-to-analog (D/A) converters. Their attractiveness for IC systems, in part, is due to the fact that they employ an easy to implement 1-bit-A/D converter.

The basic sigma-delta modulation has been well known for many years. With respect to FIG. 1, the sigma-delta modulation consists of a feedback loop in which an approximation signal q is compared to the analog input x by means of block 100. The result of the preceding comparison (x-q) is then applied to an analog filter H(s) 110. The order of the SDM is determined by the order of H(s) filter 110. For a first-order SDM is determined by the order of H(s) filter 110. For a first-order SDM, H(s) is simply an integrator, as illustrated in FIG. 1 for clarity's sake. Then, the output of Block 110 is presented to a threshold detector 120. At the end of each clock signal period the evaluation of the sign of the resulting integral is performed in order to control the value of q over the next clock signal period. The range of the values that q can take is constrained simply to a set of two different values $+V$ or $-V$ (or more generally V1 and V2) where V is equal in magnitude to the maximum value of x to be encoded. If the integral is positive, $+V$ is used to create a negative difference which drives the integral towards zero. If the integral is negative, $-V$ is used to create a positive difference which again drives the integral towards zero. The feedback loop causes the average value of q to track the average value of x, the difference resulting in a small level of in-band quantization noise due to the coding process, the latter quantization noise being generally shifted to higher frequencies by means of some oversampling and noise shaping techniques. In this way, a simple A/D conversion is achieved by means of a 1-bit A/D converter.

However, the Sigma-delta converters are limited by some non-idealities, and particularly by the signal-edge transition asymmetry of the 1-bit A/D converter: traditionally, the latter is implemented as a comparator followed by a flip-flop. A mismatch of the rise time (Tr) and and fall time (Tf), such as shown with respect to FIG. 2b, dramatically results in a non-linearity of the A/D converter transfer function characteristics. According to the value of the ratio Tf/Tr which can appear to be more or less than 1, the real transfer function characteristics are likely to be a curve which is located up or down with respect to the ideal desired transfer function characteristics such as shown in FIG. 2a, the latter being perfectly linear. The article "A Single-channel PCM codec" by J. D. EVERARD in IEEE Journal of solid-state circuits, vol. sc-14, no. 1, February 1979, pp. 145-146, clearly describes the relationship between any approximation signal-edge transition asymmetry and the resulting non-linearity and a high signal to noise ratio introduced in the A/D and D/A transfer characteristics. The EVERARD article suggests improving the linearity of the transfer function characteristics by using matching, by means of accurate or sorted electronic components, of the edge transition delays and the transition rise and fall times. Such requirements are likely to entail high manufacturing costs.

Moreover, since sigma-delta converters are likely to be used in association with attenuators in signal processing equipment, it becomes desirable to provide a linear sigma-delta converter that also allows an attenuation function, both conversion and attenuation functions providing high level of performance in terms of accuracy, linearity and independence on the precision of the electronic components included therein.

It is an object of the invention to provide improved, simple and low cost sigma-delta modulation converters insensitive to the asymmetry of the fall and rise times and delay of the switching components.

It is another object of the invention to provide an improved sigma-delta converter having a linear transfer function and also providing an accurate attenuation function.

It is a further object of the invention to provide an improved, simple sigma-delta converter providing an attenuation function, the accuracy of which being independent on the precision of the components.

It is a further object of the invention to provide a device for improving the Signal-to-Noise ratio of a sigma-delta converter having a feedback loop.

BRIEF SUMMARY OF THE INVENTION

The objects of the invention are achieved by means of the sigma-delta converter which, according to the invention, includes a switching component controlled by a first clock signal having determined transitions for generating a train of sigma-delta code pulses corresponding to an analog input value. The sigma-delta converter includes means for generating a second clock signal of the same frequency as the first clock and having a negative transition followed after a defined period of time (d2) by a positive transition. The determined transitions of the first clock signal controlling the switching element occur during said defined period of time. There is also included means controlled by the sigma-delta code pulse train and said second clock signal for generating a train of sigma-delta pulses insensitive to the mismatch of the rise and fall times of said switching element, thereby improving the linearity and the signal-to-noise ratio of the converter. The control of the said period of time allows the variation of the energy of the pulses in order to provide pulses train which, when applied to a sigma-delta decoder, provide an analog output value representative of but attenuated with respect to, the analog input value.

DETAILED DESCRIPTION OF THE PREFERRED EMBODIMENT

Figure 1:
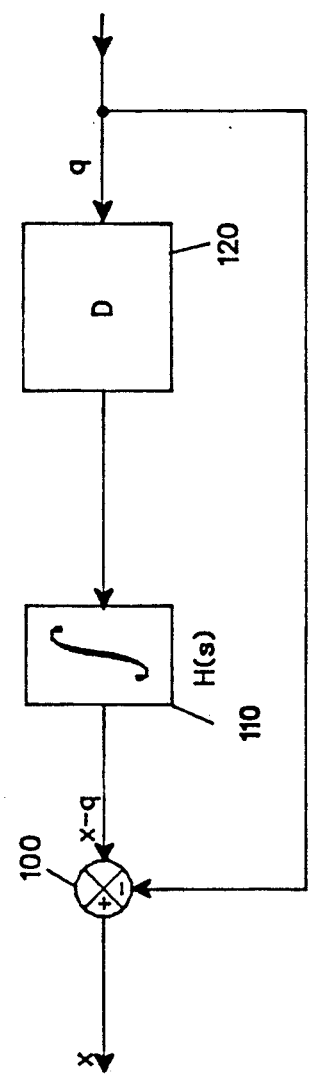
FIG. 1 is a block diagram describing the broad principle of sigma-delta modulation.

As mentioned previously, FIG. 1 is a block diagram describing the broad principle of sigma-delta modulation.

Figure 2A:
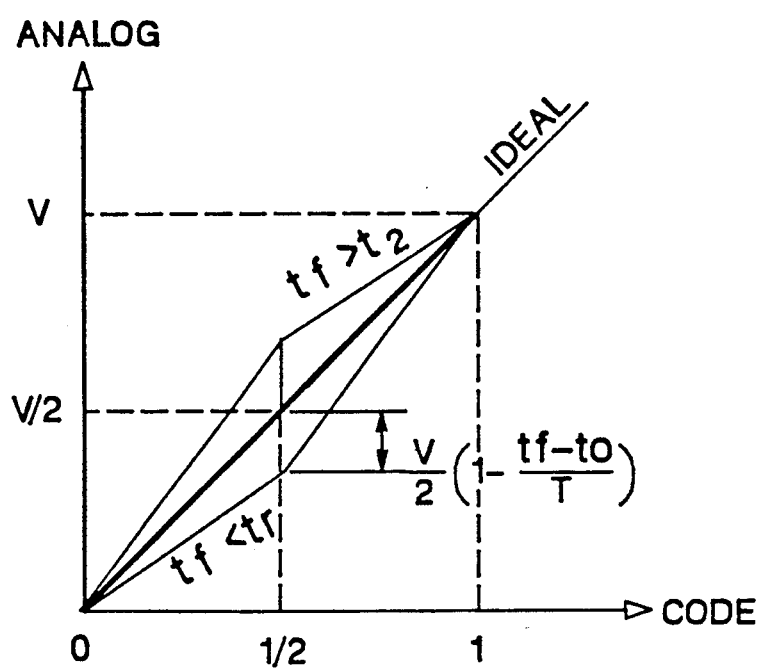
FIG. 2a and FIG. 2b respectively illustrate the non-linear transfer function characteristics of the conversion resulting from a mismatch of the rise and fall time, and a chronogram of the sigma-delta pulse having such a mismatch.
Figure 2B:
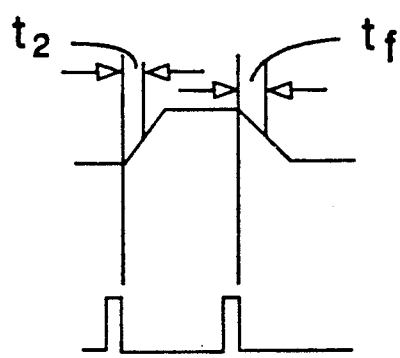

FIG. 2a and FIG. 2b, respectively, illustrate the non-linear transfer function characteristics of the conversion resulting from a mismatch of the rise and fall time, and a chronogram of the sigma-delta pulse having such a mismatch.

Figure 3:
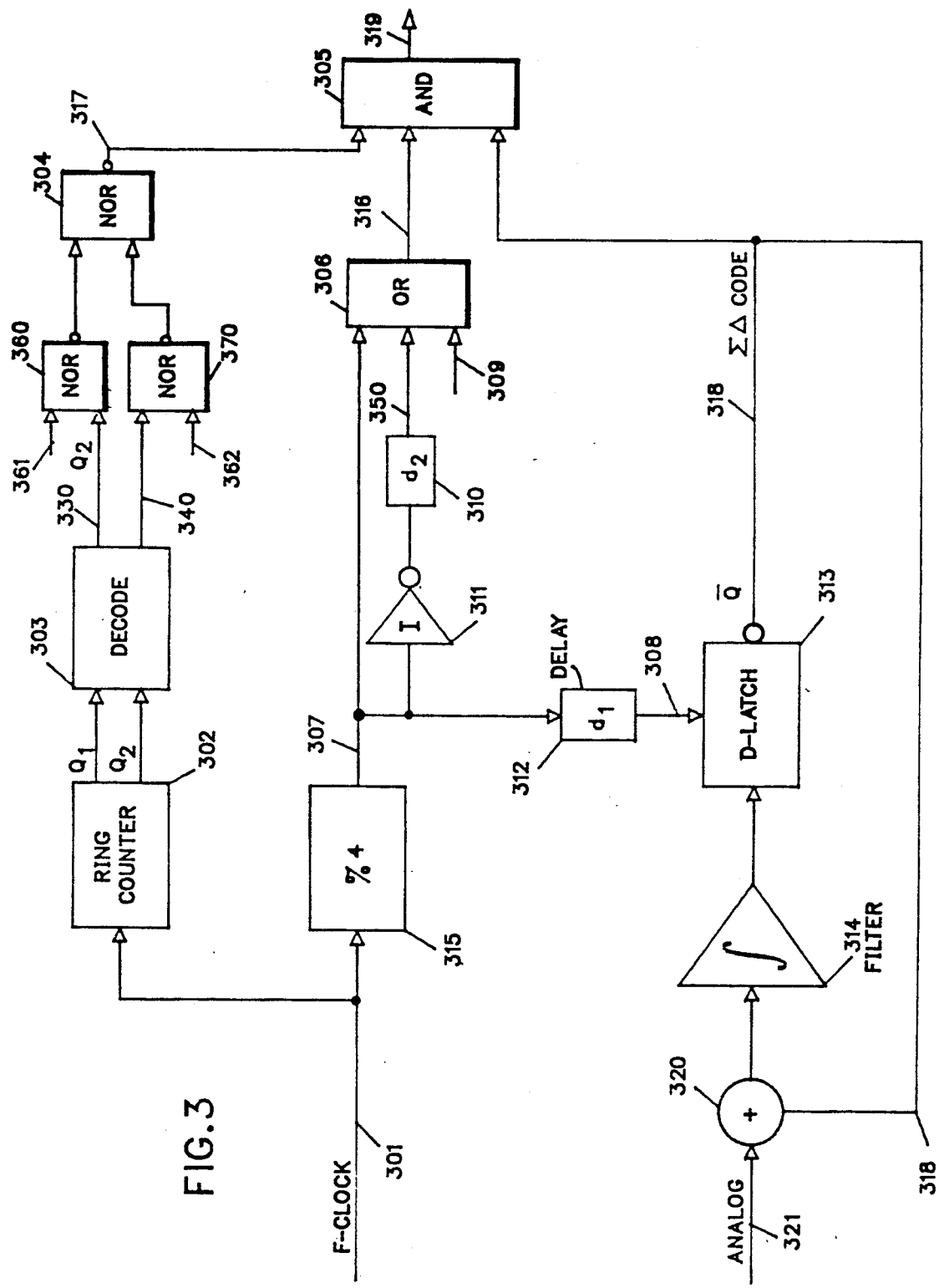
FIG. 3 describes a preferred embodiment of the sigma-delta converter of the invention providing the levels of attenuation of 0, 6 and 12 dB.

FIG. 3 describes a preferred embodiment of the sigma-delta converter of the invention providing the levels of attenuation of 0, 6 and 12 dB. As mentioned above, the sigma-delta converter includes a filter 314, in this case being an integrator which is connected to the output of an adder circuit 320. The adder circuit 320 performs the addition of the input value to be converted on a lead 321, being analog or digital in the case of PCM for instance, and the sigma-delta code appearing at the inverted output of a D-latch 313, the input of which being connected to the output of integrator 314.

A lead 301, carrying a Fck clock signal having a frequency being four times that of the sigma-delta pulse train, is connected to a 2 stage ring-counter circuit 302 and a divide-by-4 circuit 315. Ring counter 302 generates two Q1 and Q2 signals which are decoded by decode circuit 303 in order to generate a set of two signals on leads 330 and 340. Lead 330 is connected to a first input of a NOR gate 360 having a second input connected to a lead 361, the output of NOR gate 360 being connected to a first input of an NOR gate 304. Similarly, lead 340 is connected to a first input of a NOR gate 370 having a second input connected to a lead 362, the output of NOR gate 370 being connected to a second input of NOR gate 304. The output of NOR gate 304 is connected to the first input of an AND gate 305 through lead 317.

The output of divide-by-four circuit 315 is connected to a first input of an OR gate 306, to the input of an inverter 311 and to the input of a first delay circuit 312, the latter delay circuit 312 having a time-constant of d1. The output of inverter circuit 311 is connected to the input of a second delay circuit 310 for delaying the signal of period of time of d2. Each of the delay circuits 310 and 312 can be implemented by means of a series of logic gates providing the desired delay value. It should be noticed that the values of d2 must be greater than d1. In the preferred embodiment of the invention, d2 is chosen to be equal to 2×d1.

A lead 316 carrying the output signal of OR gate 306 is connected to a second input of AND gate 305, a third input of which being connected to the output lead 318 of D-latch 313 which carries the initial sigma-delta code.

The output lead 319 of AND gate 305 carries the processed sigma-delta code coming from the output lead 318 of D-latch 313. The latter processed signal can be used as a conventional sigma-delta signal and, particularly when applied to the input of sigma-delta decoder e.g. a low pass filter, provides an analog output value corresponding to the analog value existing at the input of adder 320. Because of the processing that has been performed to the initial sigma-delta signal on lead 318 according to the invention, and particularly the linearization compensation performed as will be mentioned hereinafter, the analog value generated at the output of the low pass filter is actually very close to the original analog value existing at the input of adder circuit 320 in terms of linearity. Moreover, the attenuation provided to the analog signal at the output of the (not shown) sigma-delta decoder is accurately determined and without referencing to the precision of the components.

Figure 4:
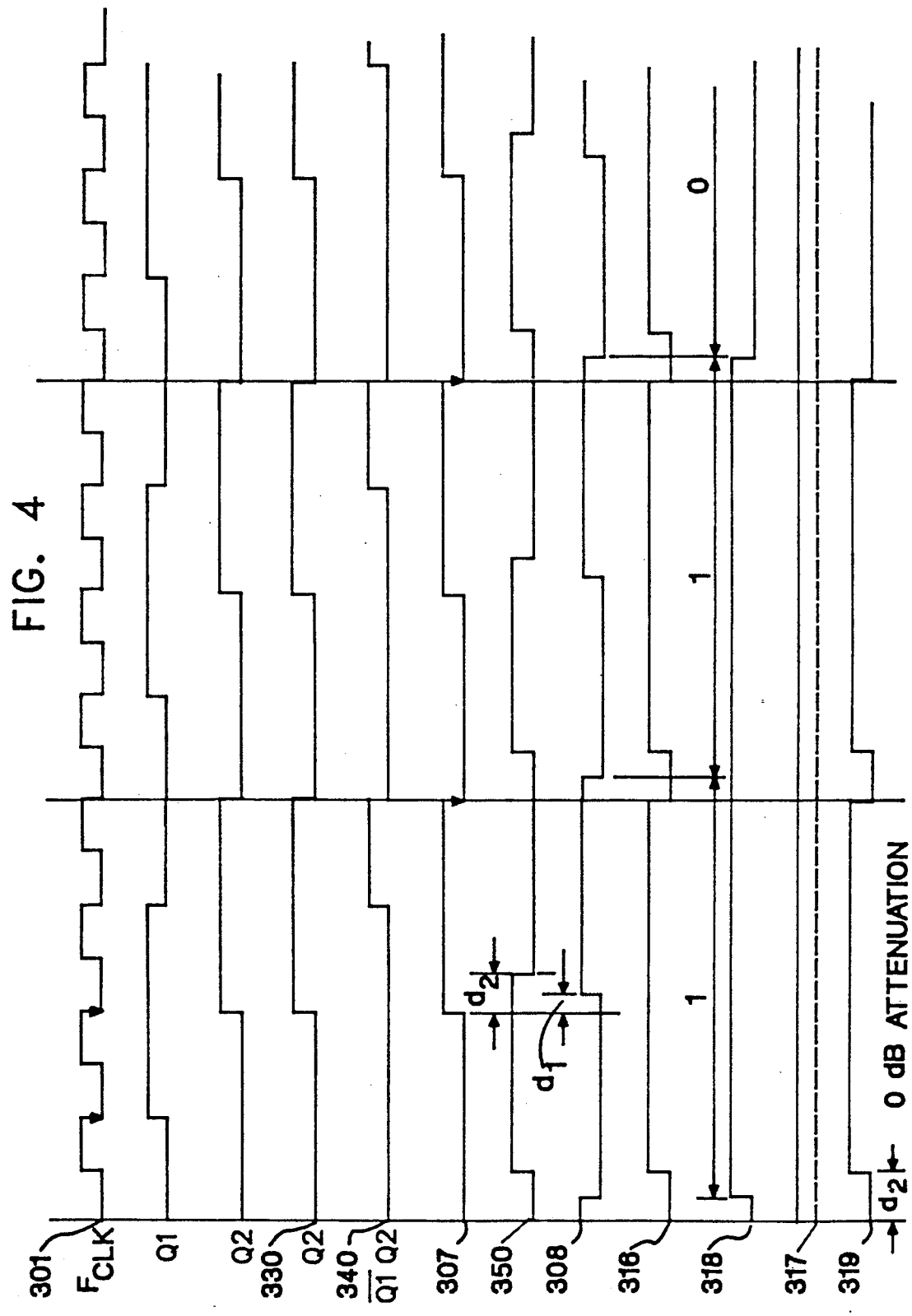
FIG. 4 is a view of the timing diagrams of significant signals existing in the sigma-delta converter according to the invention with a 0 dB attenuation level.

The operating of the sigma-delta converter of the invention, when no attenuation of the analog input value on lead 321 is required, is particularly detailed hereinafter with respect to FIG. 4 illustrating timing diagrams of the most significant signals.

As mentioned above, clock signal Fck on lead 301 has a frequency being four times that of the sigma-delta pulse train on lead 318. This is required in order to provide the desired levels of attenuation, 0.5 or 0.25 i.e. values near 6 and 12 dB. As will be seen below, the frequency of Fck clock signal on lead 301 may be higher in order to provide higher levels of attenuation. Clock signal Fck on lead 301 is then divided by four in divide-by-four circuit in order to provide a clock signal on lead 307 having the same frequency as the frequency of the sigma-delta code pulses train on lead 318. The signal on lead 307 is inverted by inverter 311, then delayed in delay circuit 310 and then applied to OR gate 306 by means of lead 350. The signals on lead 307 and lead 350 provide at the output of OR gate 306, when lead 309 is at a high level, a signal on lead 316 having the same frequency as signal on lead 307 but a duty cycle depending on the value of the time constant d2 of delay circuit 310. The signal on lead 316 is particularly shown with respect to FIG. 4. It should be noted that, in the latter figure, the value of d2 has been extremely increased for clarity's sake. In the reality, d2 is very weak with respect to the clock frequency of the signal on lead 307. The signal on lead 307 is also delayed by an amount d1 by means of delay circuit 312 and the output of delay circuit 312 is used to clock D-latch 313 in order to provide the sigma-delta code on lead 318 at the inverting output of D-latch 318. As mentioned above, the value of d1 is chosen smaller than that of d2 in order to make sure that the clocking of D-latch 313 occurs when 316 signal is at a low level. Typically, the value of d1 is half that of d2. Because no attenuation of the analog input value on lead 321 is required in this case, the signal on lead 317 continuously remains at a high level by means of a high level existing on control leads 361 and 362. Therefore, the signal appearing on lead 319 corresponds to the logical AND of both 316 and 318 signals as shown with respect to FIG. 4. Since the clocking of D-latch 313 occurs in the interval when 316 signal is at a low level (typically the middle of the interval), the signal on lead 319 is a sigma-delta code signal having a small gap of d2 at the beginning of each "1" of the sigma-delta code. More precisely, when a positive transition on lead 318 occurs (corresponding to the transition of a "0"0 to a "1"), the transition on output lead 319 is delayed until the corresponding positive transition on lead 316. When a negative transition on lead 318 occurs, 319 has already been set at a low level since the last negative transition of 316 signal. Therefore, 319 signal appears to be a sigma-delta code pulse train having a small gap at the beginning of "1" of the sigma-delta code. Since the "depth of the gap" is very small with respect to the frequency of the clock signal on lead 307, or more precisely since d2 is very small with respect to the frequency of signal 307, the effect of this on the attenuation performed at the analog output of the (not shown) sigma-delta decoder can be considered as being negligible. However, the effect of this "gap" is considerable in terms of linearity and signal-to-noise ratio.

As mentioned above, non-symmetrical rise and fall times entail distortion and additional noise. The generation of a negative transition followed by a positive transition after a period d2 by means of OR gate 306 and particularly at the beginning of each "1" included into the sigma-delta code appearing on lead 318 provides a compensation of the mismatch of the rise and fall times causing an offset, but reducing non-linearity, and hence, noise. As a matter of fact, in a conventional sigma-delta converter, the weight of an isolated 1 (respectively 0) is different from that of a 1 (respectively 0) imbedded in a sequence of 1's (respectively 0's). In the first instance, its theoretical weight is increased or decreased by the amount of rise/fall time mismatch relative to the theorical bit duration. In the second instance, it has the theoretical weight, since no transition occurs and, consequently, there is no rise/fall time mismatch.

The error introduced by the rise/fall times mismatch is thus proportional to the density of transitions which is null when the signal to be coded is either at its maximum or minimum input value. The latter density is maximum at midrange and yields there a maximum error as can be seen in FIG. 2. In the sigma-delta converter according to the invention, each "1" is associated to two transitions and the error associated with the rise/fall time mismatch is constant and independent on the input signal.

It should be noticed that typically, the dissymetry of latch of the type 74HC74 that is currently marketed to the general public may be about 2.5 nanosecond, the ratio between the latter time and the period of the clock signal 307 therefore being about 0,0022. Since, such sigma-delta converters are likely to be used in conjunction with attenuators, it is also highly desirable to provide an attenuation circuit providing such a precision without requiring the use of matched components. An accurate attenuation is achieved in the sigma-delta converter of the invention by means of NOR gate 304 allowing the control of the width of the above gap, that is to say the control of the period separating the instants of the negative and the positive transition forming the above mentioned "gap".

Figure 5:
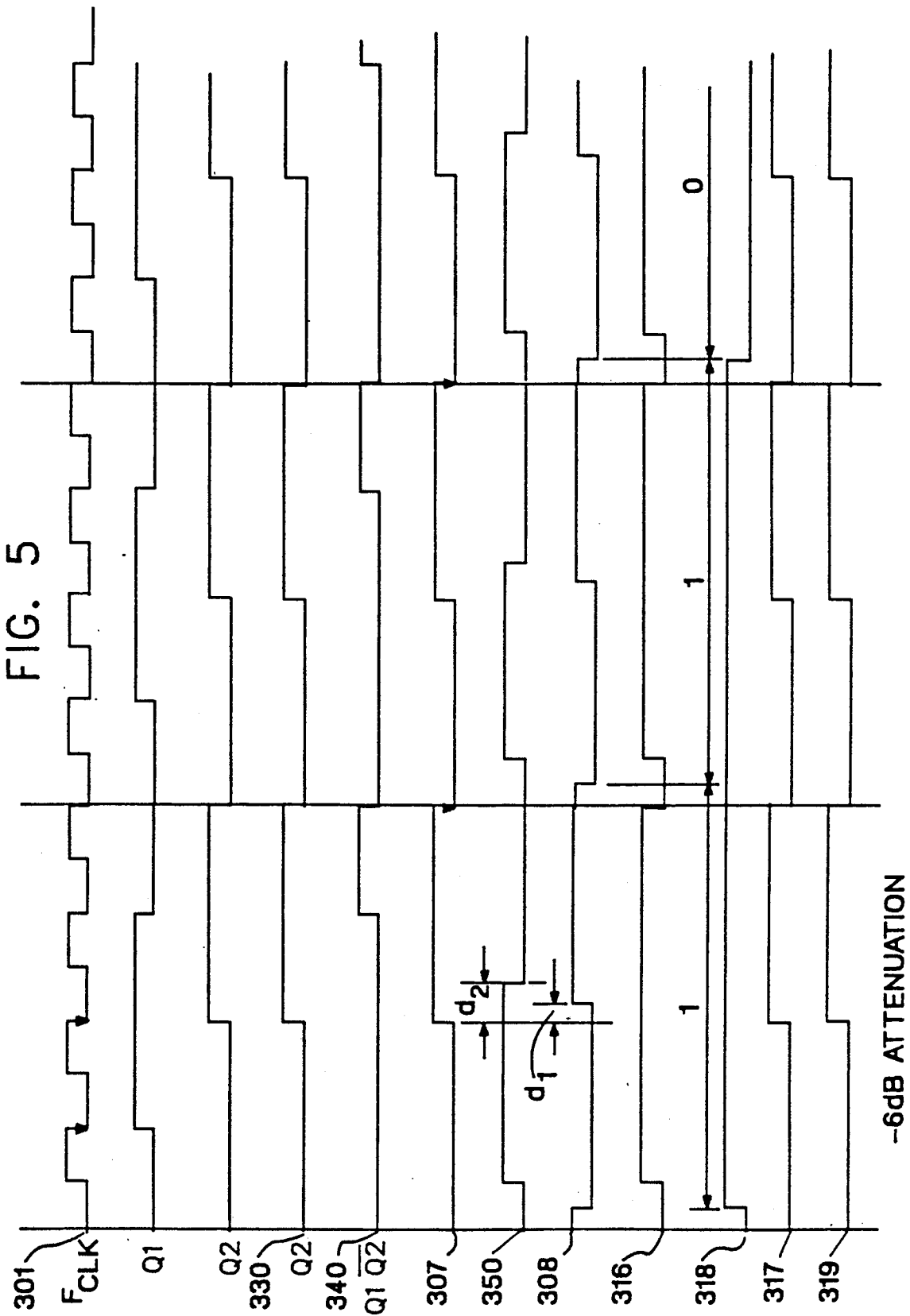
FIG. 5 is a view of the timing diagrams of significant signals existing in the sigma-delta converter according to the invention with a 6 dB attenuation level.
Figure 6:
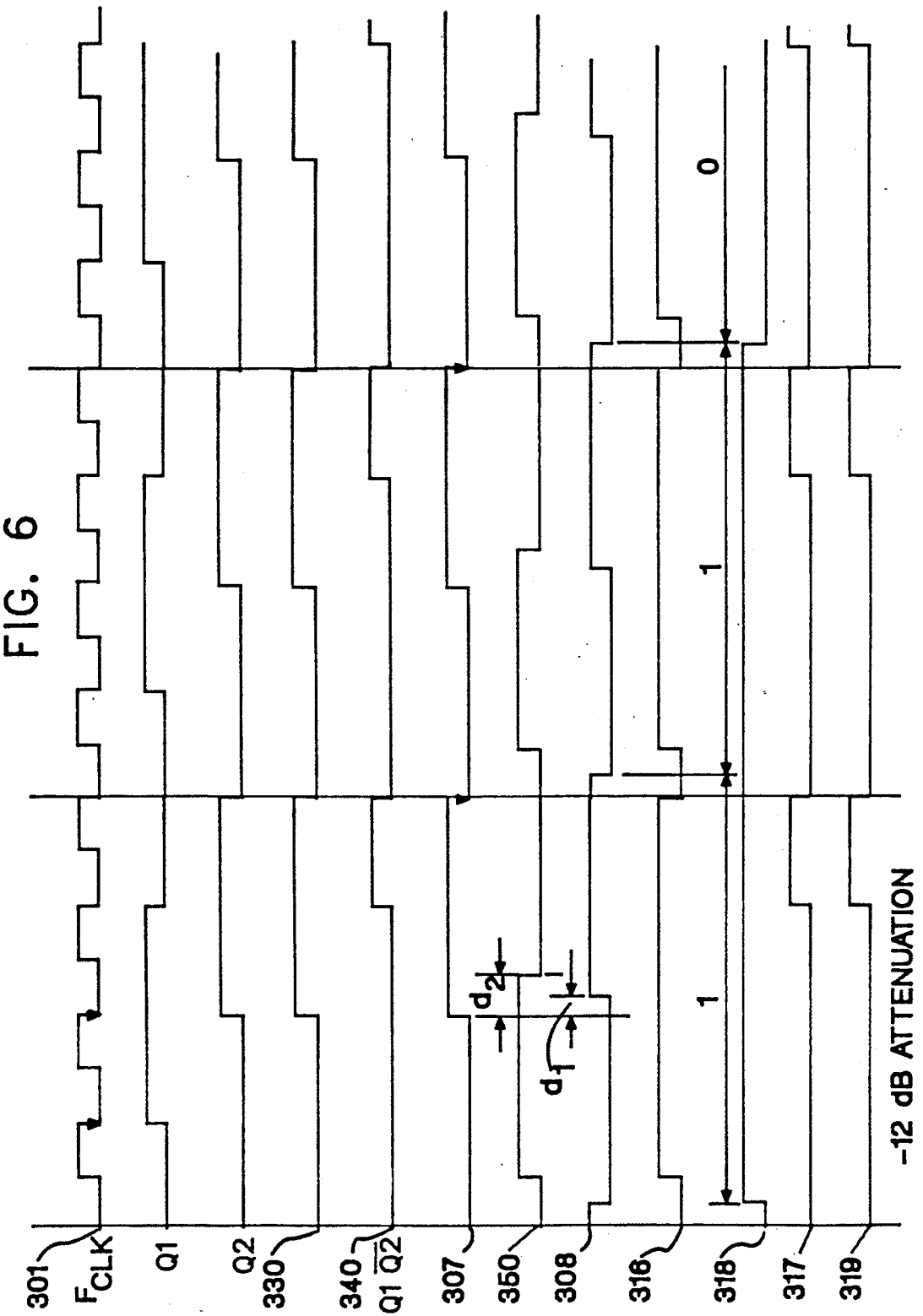
FIG. 6 is a view of the timing diagrams of significant signals existing in the sigma-delta converter according to the invention with a 12 dB attenuation level.

Examples of the operating of the sigma-delta converter of the invention providing different attenuation levels is illustrated with respect to FIGS. 5, 6 and 3.

As previously, Fck clock signal on lead 301 has a frequency being four times that of 307 signal clock. Fck clock signal is transmitted to a 2 stage ring counter of the type "Johnson ring counter" which provides delayed divided-by-four Q1 and Q2 signals. The corresponding shapes of Q1 and Q2 signals are shown in FIG. 5. Q1 and Q2 signals are then applied to decode logic circuit 303, the purpose of which being to generate signals of the same frequency and synchronized with 307 clock signal, but having a determined duty cycle that will perform the adequate attenuation. Decode circuit 303 respectively generates a first signal and a second signal on lead 330 and lead 340 which has a duty cycle of respectively ½ and ¼ as shown in FIG. 5. The relationship between those and Q1 and Q2 signals can be expressed by means of the following boolean formulas:

Signal on lead 330 = Q2
Signal on lead 340 = (inverted Q1) . Q2

If an attenuation level of 0.5 (6 dB attenuation) is required, control lead 361 is set to a low level while control lead 362 is set to a high level. Therefore, the signal on lead 330 is transmitted to lead 317 through NOR gates 360 and 304 which can be mixed in AND gate 305 with the sigma-delta code existing on lead 318. The resulting signal on lead 319, as shown in FIG. 5, is a sigma-delta code signal, the energy of the pulse corresponding to the code "1" being exactly half the energy of the pulse corresponding to the code "1" existing on lead 318. Signal 319 can consequently be transmitted to a sigma-delta decoder, e.g. a low pass filter, the output of which will generate an analog output value being exactly half the analog input value on lead 321. Therefore, an attenuation level near 6 dB can be obtained.

However, if an attenuation level of 0.25 (12 dB attenuation) is wished, control lead 362 is set to a low level while control lead 361 is set to a high level. Therefore, the signal on lead 340 is transmitted to lead 317 through NOR gates 370 and 304 which can be mixed in AND gate 305 with the sigma-delta code existing on lead 318. The resulting signal on lead 319, as shown in FIG. 6, is a sigma-delta code signal, the energy of the pulse corresponding to the code "1" being exactly 25 per cent the energy of the pulse corresponding to the code "1" existing on lead 318. Signal 319 can consequently be transmitted to a sigma-delta decoder, e.g. a low pass filter, the output of which will generate an analog output value being exactly 25 per cent of the analog input value on lead 321. The attenuation level is near 12 dB in this case.

It should be noticed that decode circuit 303 also generates a third output signal (not shown) being equal to Q1+Q2 (with respect to the boolean algebra) and which has a duty cycle of ¾. The mixing of this third signal, similarly to above, then provides an attenuation level near 9 dB.

Figure 7:
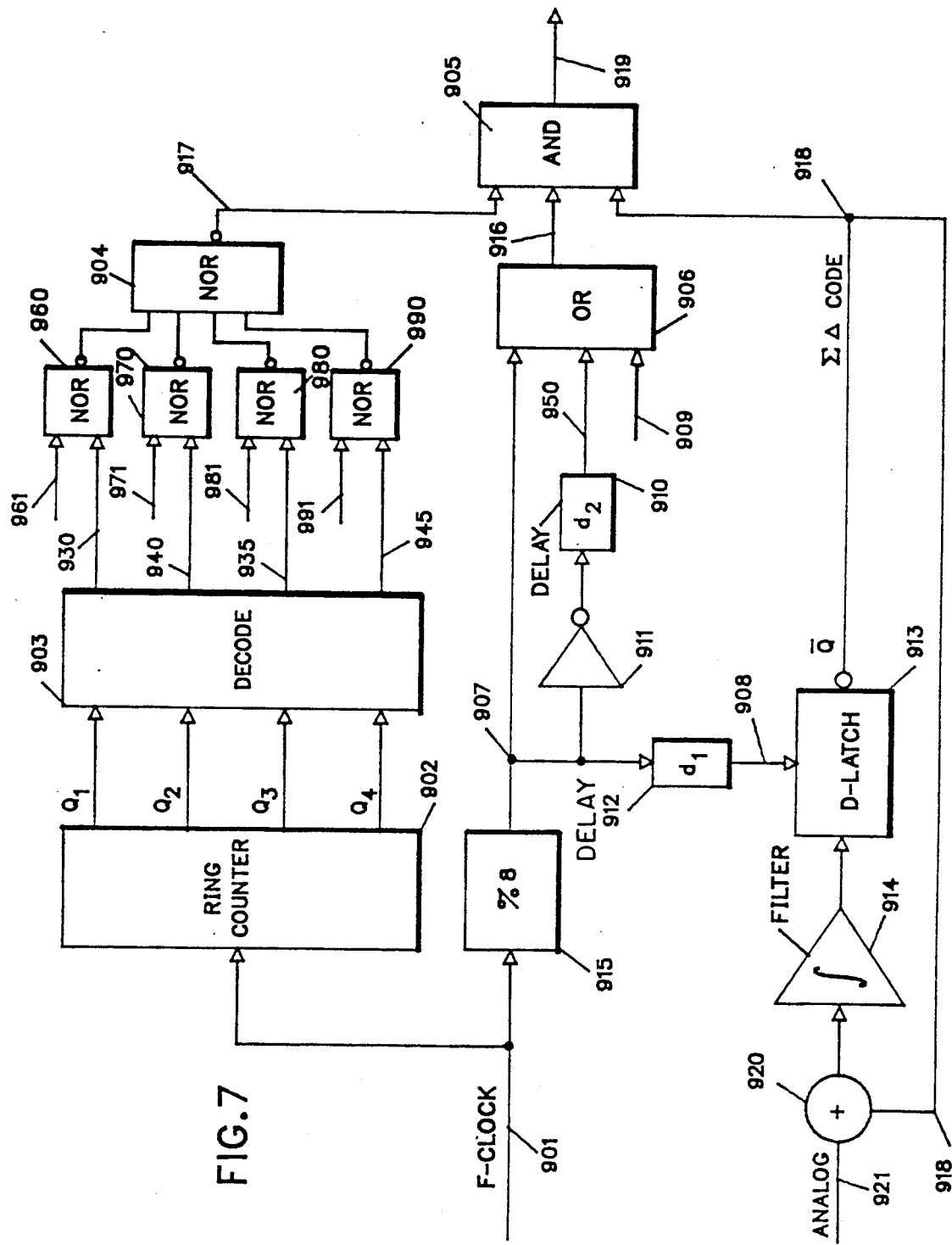
FIG. 7 is a second embodiment of the sigma-delta converter according to the invention providing the levels of attenuation of 6, 12 and 18 dB.

FIG. 7 describes a second embodiment of the invention which provides further attenuation levels, and particularly attenuation levels of ⅛, ¼ and ½ (18, 12 and 6 dB attenuation values).

Similar to the above, the sigma-delta converter includes an integrator (filter) 914 which is connected to the output of an adder circuit 920. The adder circuit 920 performs the addition of the analog value to be converted on a lead 921 and the sigma-delta code appearing at the inverted output of a D-latch 913, the input of which being connected to the output of integrator 914.

A lead 901, carrying a Fck clock signal having a frequency being EIGHT times that of the sigma-delta pulse train, is connected to a 4 stage ring-counter circuit 902 generating delayed Q1, Q2, Q3 and Q4 signals and a divide-by-8 circuit 914. From the latter Q1, Q2, Q3 and Q4 signals, decode circuit 303 generates a set of four signals on lead 930, 935, 940 and 945. Lead 930 is connected to a first input of an NOR gate 960 having a second input connected to a lead 961, the output of NOR gate 960 being connected to a first input of an NOR gate 904. Similarly, lead 935 is connected to a first input of a NOR gate 970 having a second input connected to a lead 971, the output of NOR gate 970 being connected to a second input of NOR gate 904.

Lead 940 is connected to a first input of an NOR gate 980 having a second input connected to a lead 981, the output of NOR gate 980 being connected to a third input of an NOR gate 904. At last, lead 945 is connected to a first input of a NOR gate 990 having a second input connected to a lead 991, the output of NOR gate 990 being connected to a fourth input of NOR gate 904.

The output of NOR gate 904 is connected to the first input of an AND gate 905.

The output of divide-by-eight circuit 915 is connected to a first input of an OR gate 906, to the input of an inverter 911 and to the input of a first delay circuit 912, the latter delay circuit 912 having a time-constant of d1. The output of inverter circuit 911 is connected to the input of a second delay circuit 910 for delaying the signal of period of time of d2. Similarly as above, the value of d2 must be superior than d1, for example d2=2×d1.

A lead 916 carrying the output signal of OR gate 906 is connected to a second input of AND gate 905, a third input of which being connected to the output lead 918 of D-latch 913 which carries the initial sigma-delta code.

The output lead 919 of AND gate 905 carries the processed sigma-delta code coming from the output lead 918 of D-latch 913. The latter processed signal can be used as a conventional sigma-delta signal and particularly, when applied to the input of sigma-delta decoder e.g. a low pass filter, provides an analog output value corresponding to the analog value existing at the input of adder 920.

Figure 8:
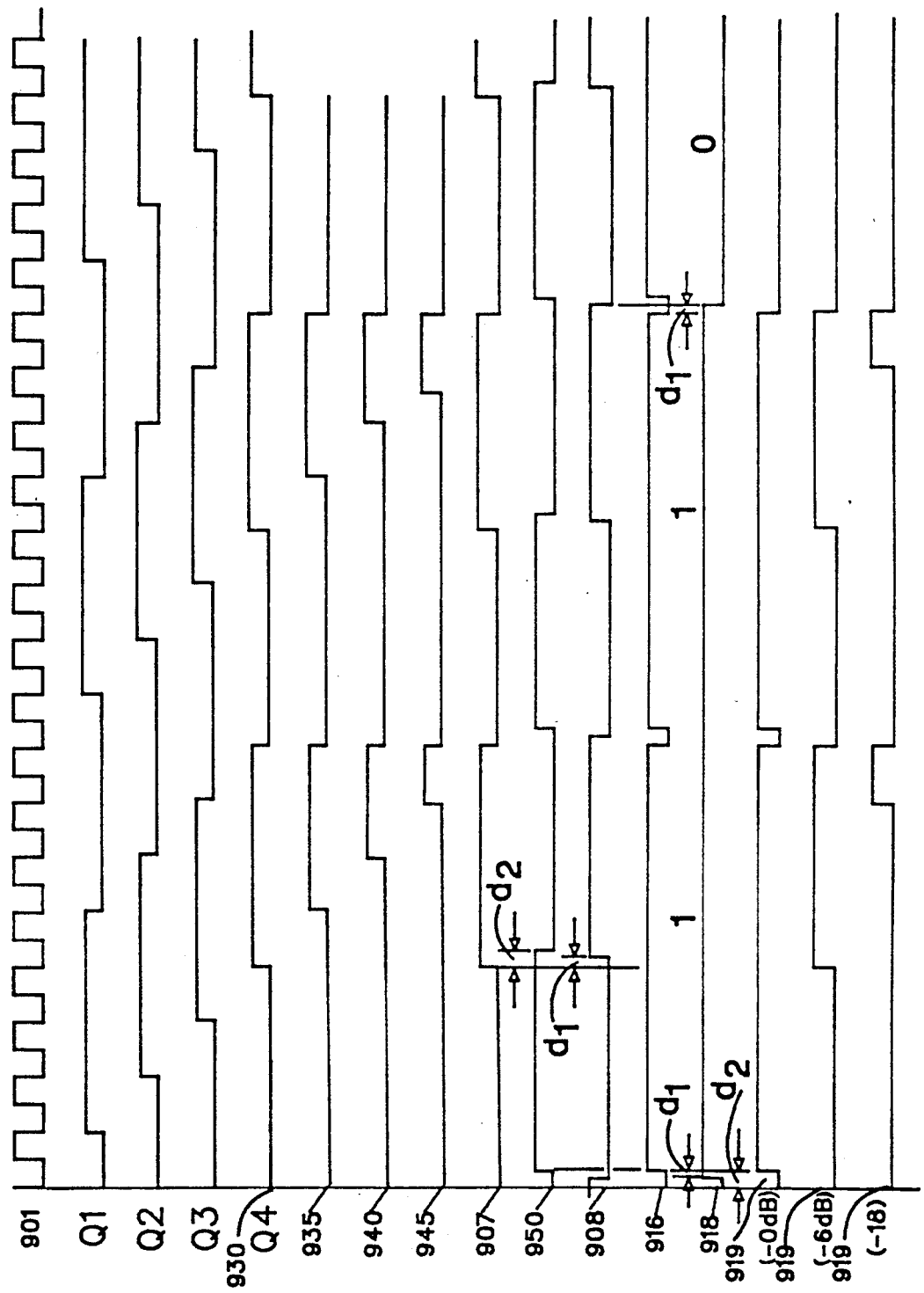
FIG. 8 illustrates time diagrams of the most significant signals in the second embodiment of the invention.

The operation of this second embodiment is described hereinafter with respect to the FIG. 8 illustrating the time diagrams of the most significant signals.

When no attenuation is required, control signals 961, 971, 981 and 991 are set to a high level in order to maintain 917 signal at a high level. Clock signal Fck on lead 901 is divided by eight in divide-by-eight circuit in order to provide a clock signal on lead 907 having the same frequency than the frequency of the sigma-delta code pulses train on lead 918. The signal on lead 907 is inverted by inverter 911, then delayed in delay circuit 910 and then applied to OR gate 906 by means of lead 950. The signals on lead 907 and lead 950 provide at the output of OR gate 906, when lead 909 is at a high level, a signal on lead 916 having the same frequency than signal on lead 907 but a duty cycle depending on the value of the time constant d2 of delay circuit 910. The signal on lead 916 is particularly shown with respect to FIG. 8. Similarly as above, the value of d2 is shown greatly exaggerated for clarity's sake. The signal on lead 907 is also delayed of a amount of d1 by means of delay circuit 912 and the output of delay circuit 912 is used to clock D-latch 913 in order to provide the sigma-delta code on lead 918 at the inverting output of D-latch 918. As mentioned above, the value of d1 is chosen smaller than that of d2 in order to make sure that the clocking of D-latch 913 occurs when 916 signal is at a low level. Typically, the value of d1 is half that of d2.

Because no attenuation of the analog input value on lead 921 is required in this case, the signal on lead 917 continuously remains at a high level because of the high level existing on control leads 961, 971, 981 and 991. Therefore, the signal appearing on lead 919 corresponds to the logical AND of both 916 and 918 signals as shown with respect to FIG. 8. Since the clocking of D-latch 913 occurs in the interval when 916 signal is at a low level (typically the middle of the interval), the signal on lead 919 is a sigma-delta code signal having a small gap of d2 at the beginning of each "1" of the sigma-delta code similarly than below, thereby substantially improving the signal-to-noise ratio and the linearity of the transferfunction of the sigma-delta decoder, accordingly to what is described above.

Examples of the operating of the sigma-delta converter of the invention providing different attenuation levels, and particularly the attenuation levels of $\frac{1}{2}$, $\frac{1}{4}$, $\frac{1}{8}$ and 1/16, are illustrated with respect to FIG. 8.

Fck clock signal is transmitted to 4-stage ring counter 902 which provides the four delayed signals Q1, Q2, Q3 and Q4. The corresponding shapes of the latter signals are shown in FIG. 8. These are then applied to decode logic circuit 903, the purpose of which being to generate signals of the same frequency and synchronized with 907 clock signal, but having a determined duty cycle that will perform the adequate attenuation. Decode circuit 903 respectively generates a first signal, a second, a third and a fourth signal on respectively lead 930, lead 935, lead 940 and lead 945 which has respectively a duty cycle $\frac{1}{2}$, $\frac{1}{4}$, 2/8 and $\frac{1}{8}$ as shown in FIG. 8. The relationship between those and Q1, Q2, Q3 and Q4 signals can be expressed by means of the following boolean formulas:

Signal on lead 930=Q4
Signal on lead 935=Q4.(inverted Q1)
Signal on lead 940=Q4.(inverted Q2)
Signal on lead 945=Q4.(inverted Q3)

If an attenuation level of $\frac{1}{2}$ (6 dB attenuation) is required, control lead 961 is set to a low level while other control leads 971, 981 and 991 are set to a high level. Therefore, the signal on lead 930 is transmitted to lead 917 through NOR gates 960 and 904 which can be mixed in AND gate 905 with the sigma-delta code existing on lead 918. The resulting signal on lead 919, as shown in FIG. 8, is a sigma-delta code signal, the energy of the pulse corresponding to the code "1" being exactly half the energy of the pulse corresponding to the code "1" existing on lead 918 what provides a near 6 dB attenuation level.

If an attenuation level of 0.25 (12 dB attenuation) is required, control lead 971 is set to a low level while other control leads 961, 981 and 991 are set to a high level. Therefore, the signal on lead 940 is transmitted to lead 917 through NOR gates 960 and 904 which can be mixed in AND gate 905 with the sigma-delta code existing on lead 918. The resulting signal on lead 919 is a sigma-delta code signal, the energy of the pulse corresponding to the code "1" being exactly 25 per cent of the energy of the pulse corresponding to the code "1" existing on lead 918, what provides a near 12 dB attenuation level.

If an attenuation level of $\frac{1}{8}$ (18 dB attenuation) is required, control lead 991 is set to a low level while other control leads 971, 981 and 961 are set to a high level. Therefore, the signal on lead 945 is transmitted to lead 917 through NOR gates 960 and 904 which can be mixed in AND gate 905 with the sigma-delta code existing on lead 918.

The resulting signal on lead 919, as shown in FIG. 8, is a sigma-delta code signal, the energy of the pulse corresponding to the code "1" being exactly 12,5 per cent of the energy of the pulse corresponding to the code "1" existing on lead 918 which provides a 18 dB attenuation level.

Similarly as above, the signals Q1, Q2, Q3 and Q4, when combined in all combinatory ways, allow a large set of attenuation levels between 0 and 18 dB while substantially linearizing the transfer function of the sigma-delta converter.

More generally, according to the frequency of clock signal Fck on lead 901 which can be any multiple of the frequency of clock signal 907, it is possible to provide a full range of accurate attenuation levels associated with a linear sigma-delta converter. Let us assume that the ratio between Fck and 907 clock signal be equal to n. The use of a n/2 stage ring counter provides a set of n signals: Q1, Q2 ..., Qn. The combinatory combination of whose generates a full set of signals, the mixing of which to a sigma-delta code provide a full range of attenuation levels while substantially linearizing the transfer function of the sigma-delta converter.

It should be noted that the invention is not restricted to SDM converters. Particularly, PDM (Pulse density Modulation) or PWM (Pulse Width Modulation) codes may be embodied according to the invention.

It should also be noticed that the invention has been particularly implemented with "gaps" corresponding to a "return to zero" of the sigma-delta code when a "1" is generated. It is straightforward for the man skilled in the art to implement the invention with "gaps" corresponding to a "return to ONE" of the sigma-delta code when a "0" is generated.

We claim:

1. A sigma-delta converter including a switching component (313) controlled by determined transitions of a first clock signal (308) for generating a train of sigma-delta code pulses corresponding to an analog input value characterized in that said converter comprises:

means (306, 310, 311) for generating a second clock signal of the same frequency as said first clock signal and having a first transition of a first polarity followed after a defined period of time (d2) by a second transition of a second polarity opposite to said first polarity transition, said determined transitions of said first clock signal occurring during said defined period of time;

and means (305) controlled by said sigma-delta code pulse train and said second clock signal for generating a train of sigma-delta pulses being insensitive to the mismatch of the rise and fall times of said switching element (313) whereby improving a signal-to-noise ratio and linearity of the sigma-delta converter;

and said converter further including means for varying said period of time in order to vary an energy of an elementary positive pulse of said sigma-delta pulse train in order to provide an attenuation function.

2. A sigma-delta converter according to claim 1 characterized in that said converter further includes:

a third clock signal (301) having a frequency being equal to n times the frequency of said first clock signal means (315, 312) for dividing said third clock signal in order to provide said first clock signal means (302, 303) controlled by said third clock signal (301) for generating signals having different determined duty cycles corresponding to different attenuation values and having the same frequency than said first clock signal means (304) for choosing one among said signals of different duty cycles whereby providing a sigma-delta pulses which, when applied to a sigma-delta decoder, provides an analog output value being representative but attenuated with respect to said input analog value.

* * * * *